US008384425B2

(12) United States Patent
Mazure et al.

(10) Patent No.: US 8,384,425 B2
(45) Date of Patent: Feb. 26, 2013

(54) ARRAYS OF TRANSISTORS WITH BACK CONTROL GATES BURIED BENEATH THE INSULATING FILM OF A SEMICONDUCTOR-ON-INSULATOR SUBSTRATE

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/961,293

(22) Filed: Dec. 6, 2010

(65) Prior Publication Data
US 2011/0133776 A1 Jun. 9, 2011

(30) Foreign Application Priority Data

Dec. 8, 2009 (FR) .................................... 09 58747

(51) Int. Cl.
*H03K 19/173* (2006.01)
*H03K 3/01* (2006.01)
*H01L 27/12* (2006.01)

(52) U.S. Cl. .......................... 326/38; 257/347; 327/334
(58) Field of Classification Search .................. None
See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,841,175 A * | 11/1998 | Sugiura et al. | 257/392 |
| 5,844,845 A | 12/1998 | Tahara | 365/189.05 |

(Continued)

FOREIGN PATENT DOCUMENTS

| | | |
|---|---|---|
| EP | 1 081 748 A2 | 3/2001 |
| EP | 1 095 407 A1 | 5/2001 |

(Continued)

OTHER PUBLICATIONS

European Search Report Application No. EP 10 29 0217 dated Sep. 15, 2010.

(Continued)

*Primary Examiner* — Crystal L Hammond
(74) *Attorney, Agent, or Firm* — Winston & Strawn LLP

(57) ABSTRACT

This invention provides a semiconductor device structure formed on a conventional semiconductor-on-insulator (SeOI) substrate and including an array of patterns, each pattern being formed by at least one field-effect transistor, each FET transistor having, in the thin film, a source region, a drain region, a channel region, and a front control gate region formed above the channel region. The provided device further includes at least one FET transistor having a pattern including a back control gate region formed in the base substrate beneath the channel region, the back gate region being capable of being biased in order to shift the threshold voltage of the transistor to simulate a modification in the channel width of the transistor or to force the transistor to remain off or on whatever the voltage applied on its front control gate. This invention also provides methods of operating such semiconductor device structures.

18 Claims, 10 Drawing Sheets

U.S. PATENT DOCUMENTS

| | | | |
|---|---|---|---|
| 5,869,872 A | 2/1999 | Asai et al. | 257/360 |
| 5,889,293 A | 3/1999 | Rutten et al. | 257/74 |
| 6,043,536 A | 3/2000 | Numata et al. | 257/347 |
| 6,063,686 A | 5/2000 | Masuda et al. | 438/406 |
| 6,072,217 A * | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,215,138 B1 * | 4/2001 | Takao | 257/288 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 7,643,346 B2 * | 1/2010 | Toriyama et al. | 365/185.17 |
| 2001/0038299 A1 | 11/2001 | Afghahi et al. | 326/86 |
| 2001/0047506 A1 | 11/2001 | Houston | 716/4 |
| 2002/0052069 A1 * | 5/2002 | Jiroku et al. | 438/166 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/230 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 * | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096036 A1 | 4/2009 | Ishigaki et al. | 257/392 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 02-264466 A | 10/1990 |
| JP | 04345064 A | 12/1992 |
| JP | 06-275883 A | 9/1994 |
| JP | 08255846 | 10/1996 |
| JP | 09-223802 A | 8/1997 |
| JP | 09232446 | 9/1997 |
| JP | 10125064 A | 5/1998 |
| JP | 2000196089 A | 7/2000 |
| JP | 2004303499 | 10/2004 |
| JP | 2009-044220 A | 2/2009 |
| KR | 10-2009-0023164 | 3/2009 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/789,100, filed May 27, 2010.
U.S. Appl. No. 12/886,421, filed Sep. 20, 2010.
U.S. Appl. No. 12/984,466, filed Jan. 4, 2011.
U.S. Appl. No. 12/942,754, filed Nov. 9, 2010.
U.S. Appl. No. 12/880,806, filed Sep. 13, 2010.
U.S. Appl. No. 12/898,230, filed Oct. 5, 2010.
U.S. Appl. No. 12/946,135, filed Nov. 15, 2010.
U.S. Appl. No. 12/974,916, filed Dec. 21, 2010.
U.S. Appl. No. 12/974,822, filed Dec. 21, 2010.
U.S. Appl. No. 13/007,483, filed Jan. 14, 2011.
U.S. Appl. No. 13/039,167, filed Mar. 2, 2011.
European Search Report Application No. EP 09290838.3 dated Feb. 16, 2010.
M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).
Ulicki, Bob et al., "De-Myth-tifying" the SOI Floating Body Effect, SOI Industry Consortium, pp. 2-7 (2009).
European Search Report Application No. EP 10290181.6 dated Jan. 14, 2011.
U.S. Appl. No. 13/013,580, filed Jan. 25, 2011.
U.S. Appl. No. 12/793,553, filed Jun. 3, 2010.
U.S. Appl. No. 12/793,515, filed Jun. 3, 2010.
U.S. Appl. No. 12/789,515, filed May 27, 2010.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.

Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).

D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).

K. Itoh, et al., "Impact of FD-SOI on Deep-Sub-100-nm CMOS LSIs—A View of Memory Designers" Central Research Laboratory, Tokyo, Japan, 2 pages.

M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al. "An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al. "SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, (2007).

K. Roy, et al. "Double-Gate SOI Devices for Low-Power and High-Performance Applications," IEEE Computer Society, The British Library, IEEE Xplore, 8 pages, (2006).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

* cited by examiner

| BG1 | T1 | BG2 | T2 | BG3 | T3 | BG4 | T4 | OUT |
|---|---|---|---|---|---|---|---|---|
| vpp | ON | -vpp | OFF | vpp | OFF | -vpp | ON | /A |
| -vpp | OFF | 0 | active | -vpp | ON | vdd | active | /B |
| 0 | active | -vpp | OFF | vdd | active | -vpp | ON | /(A.B) |
| vpp | ON | 0 | active | vpp | OFF | vpp | active | /(A+B) |

ARRAYS OF TRANSISTORS WITH BACK CONTROL GATES BURIED BENEATH THE INSULATING FILM OF A SEMICONDUCTOR-ON-INSULATOR SUBSTRATE

FIELD OF THE INVENTION

The present invention is related to the field of semiconductor processing equipment for microelectronics, and more precisely to a semiconductor device made on a semiconductor-on-insulator (SeOI) substrate based on components having uniform patterns.

BACKGROUND OF THE INVENTION

It is known that above certain critical temperatures surfaces of compound semiconductors can be impaired, e.g., by distortions and deformations. To avoid such impairments in lithographic structures that have to be transferred onto a wafer, it is also known in the art to seek to simplify lithography. For example, the prior art recommends avoiding as far as possible corners in the same lithographic plane.

Use of different channel widths of transistors is a common practice. The channel length of an MOSFET transistor is at the present time typically around 30 nm, whereas its width (W) is typically much greater. The width determines the current intensity in the transistor for given source, drain and gate voltages.

Therefore, it is usually desirable to design an electronic circuit with transistors having different channel widths. But, in practice it is difficult to obtain different widths with precision because of the resolution limits of lithography. In fact, although it is relatively easy to produce long strip-like structures by lithography, short strips of very controlled dimensions are particularly difficult to fabricate.

US patent application 2008/0251848 teaches a fabrication process aimed at obviating inhomogeneities in performance between the various transistors of a circuit. To do so, this document proposes to make the influence of the environment on the various transistors uniform. More precisely, this document provides that an array of FET transistors be arranged in the form of long strips. The drain and source regions of any one strip then have the same dimensions, being spaced apart by gate regions of fixed dimensions. This document is further described herein.

The resolution limit of the lithography tends to dictate the use of such long strips of transistors having identical dimensions. However, with long strips, the flexibility in designing electronic circuits is then lost since it is no longer possible to vary the geometric width of the various transistors so as to modulate their performance.

SUMMARY OF THE INVENTION

The present invention provides devices and methods that obviate the variability inherent in lithographic pattern transfer, in particular, random variability due to the structuring of the lines leading to line/space/line variability. The present invention also simplifies lithography and saves wafer space by avoiding the need for shallow trench isolation (STI) and by tightening up the rules governing transistor structures (e.g., active zones, gate lines, interconnect lines, etc.). More specifically, this invention provides semiconductor device structures fabricated by lithography that are more regular and more dense.

According to a first embodiment, this invention provides a semiconductor device structure formed on a semiconductor-on-insulator (SeOI) substrate (known to comprise a thin film of semiconductor material separated from a base substrate by an insulating film) including an array of patterns, each pattern defining at least one field-effect transistor having, in the thin semiconductor film, a source region, a drain region, a channel region (the channel region being delimited by the source and drain regions), and a front control gate region formed above the channel region. The patterns of the source and drain regions are arranged in the form of rows, having the same dimensions and spaced apart by front control gate regions of fixed dimensions.

Significantly, the provided device structure further includes at least one pattern defining a FET transistor with a back control gate region formed in the base substrate beneath the channel region. This back gate region is capable of being biased in order to shift the threshold voltage of the transistor to simulate a modification in the channel width of the transistor, or to force the transistor to remain off or on whatever the voltage applied on its front control gate.

Certain preferred, but non-limiting, aspects of this device structure are the following:
Some of the patterns in a row can be formed on one and the same active zone of the thin semiconductor film of the SeOI substrate;
An isolation region can delimit the adjacent patterns, which can further include a front isolation gate formed above the active zone and a back isolation gate formed in the base substrate beneath the active zone;
A back isolation line can connect the back isolation gates of each of the isolation regions of any one row;
This back isolation line can be common to several rows;
The back isolation gate can have a conductivity of opposite type to that of the active zone;
A back gate line can connect the back gate region(s) of one or more transistors.
A back gate line can connect the back gate region(s) to ground or to a nominal supply voltage;
A back gate line can connects the back gate region(s) to an analog and (preferably, continuously) adjustable potential;
The back gate region can be isolated from the base substrate by a well of opposite conductivity;
The back gate region can have a conductivity of the same type as that of the transistor channel; and
The back gate region can have a conductivity of opposite type to that of the transistor channel.

According to a second embodiment, this invention provides a method of operating a device of this invention, wherein the back control gate region one or more transistors is biased positively or negatively, preferably by an analog and (preferably, continuously) adjustable potential, in order to shift the threshold voltage of those transistors.

According to an aspect of this method, the invention provides a method of operating a device structure of this invention, wherein the biasing is controlled so that the shift of the threshold voltage is sufficient to cause the transistor to remain off or on whatever the voltage applied to its front control gate. The shift of the threshold voltage can in particular be programmed by means of memory cells that store and deliver predetermined voltages to the back control gates. The memory cells can be interleaved between rows of the pattern (that is one row of memory cells can be between two rows of the pattern).

According to a third embodiment, this invention provides a re-programmable circuit including a device structure according of this invention interleaved with rows of memory cells that store and deliver predetermined voltages to the back control gate regions.

The present invention is described herein for convenience in terms of "rows" and "columns" that reflect a particular and conventional geometric orientation. It should be understood that this invention is independent of this particular orientation, and that this orientation can be arbitrarily rotated without changing the nature of the invention. For example, the term of "row" as used herein could be replaced with the term "column," and the term of "column" used herein could be replaced with the term "row."

Further aspects and details and alternate combinations of the elements of this invention will be apparent from the following detailed description and are also within the scope of the inventor's invention.

BRIEF DESCRIPTION OF THE DRAWINGS

The present invention will be understood more fully by reference to the following detailed description of the preferred embodiments of the present invention, non-limiting examples of specific embodiments of the invention and the appended figures in which.

DETAIL DESCRIPTION OF THE PREFERRED EMBODIMENTS

Prior to describing preferred and non-limiting embodiments of the invention, US Patent Application 2008/0251848 is further described herein.

Figure 1:
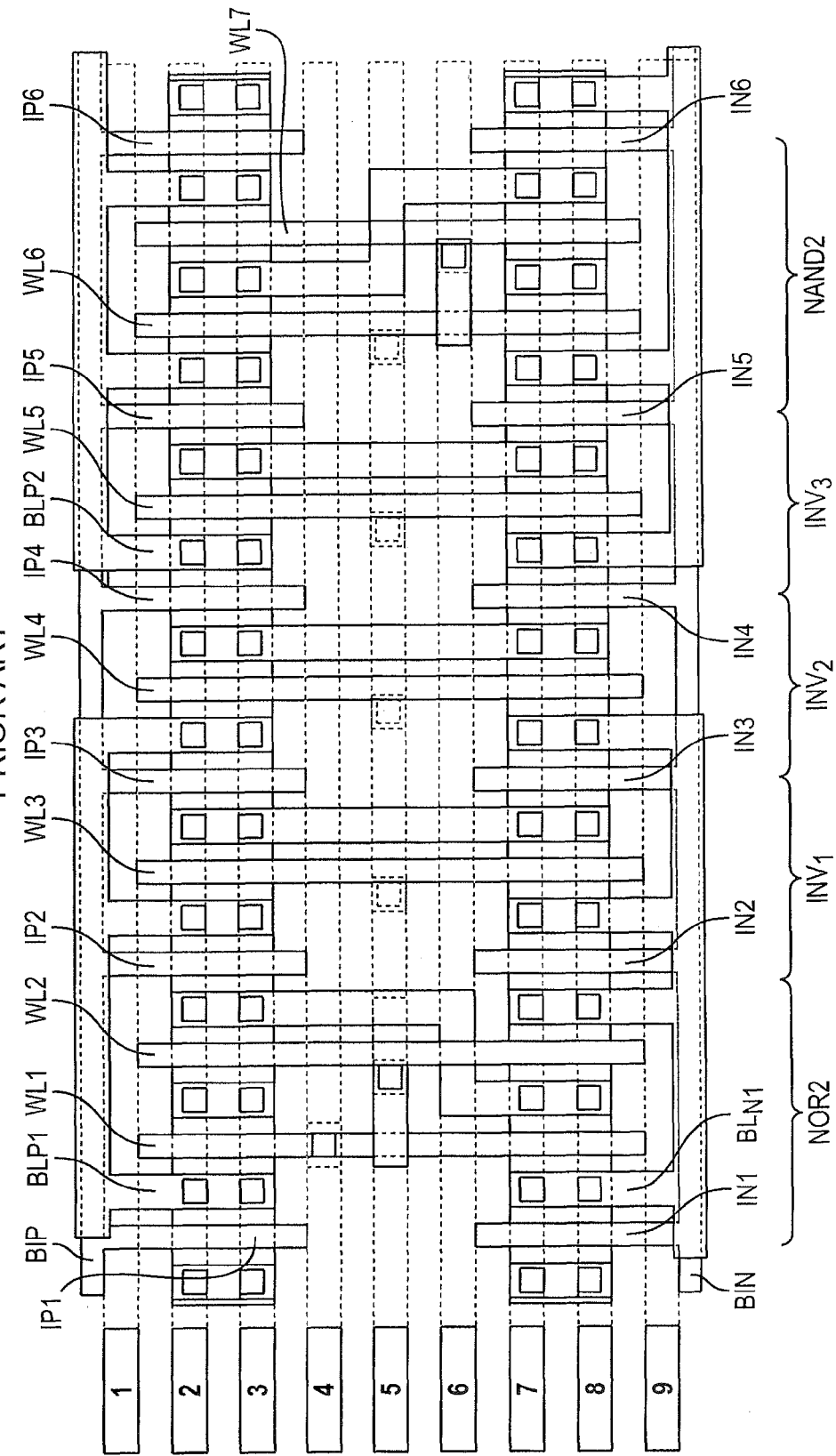
FIG. 1 illustrates a prior art circuit.

FIG. 1 of this document shows a CMOS electronic circuit according to this document. This prior-art circuit comprises an array of patterns that are formed by at least one field-effect transistor, the patterns being further arranged in the form of rows with the source and drain regions of each transistor of any one row having the same dimensions and being spaced apart by front control gate regions (WL1-WL7) of fixed dimensions. The channel width of the various transistors is then uniform, defined by the section between two perpendicular strips.

Thus, during the lithography steps only wide strips (horizontal rows and vertical front control gate regions) need be formed. It should be noted that there are no STI-type isolation trenches between adjacent transistors of any one strip. However, such isolation trenches are indeed present along the strips so as to isolate them from one another.

This prior-art circuit comprises, from left to right in FIG. 1, the following patterns: a logic gate NOR2, three inverters $INV_1$, $INV_2$ and $INV_3$ and a logic gate NAND2. More precisely, the circuit comprises, in this example, nine metal busses, the p-FET transistors being arranged along busses 2 and 3 whereas the n-FET transistors are arranged along busses 7 and 8. Busses 4 to 6 are used to make the input/output connection to these patterns and to connect these various patterns together. It is clear that other combinations are possible, with 8 to 12 metal busses being a reasonably possible number of busses. These metal busses are preferably at metal interconnect level 2 according to device technologies known in the art, and are referred to also as "metal2" busses. Herein, metal busses are preferably at interconnect level 2 unless otherwise specified.

Metal (preferably at interconnect level 1, or "metal1") supply lines $BL_{P1}$, $BL_{P2}$, $BL_{N1}$, $BL_{N2}$ of this prior-art circuit serve to fix the potential of some of the drain regions of the transistors. Thus, the drain of the first p-FET transistor of the logic gate NOR2 and the drain of the p-FET transistors of the inverters $INV_1$ and $INV_2$ are connected to the line $BL_{P1}$, whereas the drain of the p-FET transistor of the inverter $INV_3$ and the drain of the p-FET transistors of the logic gate NAND2 are connected to the line $BL_{P2}$. The drain of the n-FET transistors of the logic gate NOR2 and the drain of the n-FET transistors of the inverters $INV_1$ and $INV_2$ are connected to the line $BL_{N1}$, whereas the drain of the n-FET transistor of the inverter $INV_3$ and the drain of the first n-FET transistor of the logic gate NAND2 are connected to the line $BL_{N2}$.

The lines $BL_{P1}$ and $BL_{P2}$ are used typically to deliver a nominal supply voltage, $V_{DD}$, whereas the lines $BL_{N1}$ and $BL_{N2}$ are typically connected to ground, GND.

The patterns along a row of this prior-art circuit are formed on one and the same active zone of the substrate, and therefore isolation regions are provided between adjacent patterns. These isolation regions, each having a front isolation gate formed above the active zone, bear, in what follows, the references $I_{P1}$-$I_{P6}$ for the isolation regions linked to the p-FET transistors and the references $I_{N1}$-$I_{N6}$ for the isolation regions linked to the n-FET transistors. The front isolation gates of the isolation regions are biased by means of isolation gate supply lines $BI_P$ and $BI_N$ for the isolation regions between p-FET patterns and between n-FET patterns, respectively. These lines $BI_P$ and $BI_N$ are typically formed from a polycrystalline semiconductor material (typically polycrystalline silicon).

Turning now to the present invention, circuit structures provided by this invention are fabricated onto a conventional SeOI substrate (comprising a thin film of semiconductor material separated from a base substrate by an insulating film) and have a uniform environment similar to that shown in FIG. 1. However, unlike FIG. 1, the invention also provides a back control gate for at least one transistor in the base substrate facing the channel of the at least one transistor. By biasing the back control gate of the at least one transistor positively or negatively (typically by $+V_{DD}$ or $-V_{DD}$), the properties of this transistor may be individually modified. In particular, the threshold voltage of this transistor may be shifted. Modifying the threshold voltage is known to be equivalent to modifying the physical width of the transistor's channel.

Thus, in this invention, the physical width of the channel is defined once and for all and for all the transistors. However, it is possible to modify, individually for each transistor, the apparent (effective) width of its channel by choosing the way in which the back control gate is biased (or, in other words, driven). Since the voltage applied to the back control gate may be modified, the invention thus offers the advantage of modifying the effective channel width dynamically.

A transistor in which the channel is of n-type conductivity and a back control gate is of p-type conductivity has a very high threshold voltage. This threshold voltage may then be reduced by applying a positive voltage to the back control gate. In the present description, such a back control gate is said to have a work function.

A transistor in which the channel is of n-type conductivity and a back control gate is of n-type conductivity has a nominal threshold voltage (that is, a threshold voltage expected for a transistor of this type and configuration). This threshold voltage can be reduced by applying a positive voltage to the back control gate. In the present description, such a back control gate is said to have no work function.

This variation in the threshold voltage of the transistor via the back control gate may be formulated as $V_{th}=V_{t0}-\alpha V_{BG}$, where $V_{th}$ represents the threshold voltage of the transistor, $V_{BG}$ represents the voltage applied to the back control gate, $V_{t0}$ represents the nominal threshold voltage (which may be shifted by the work function depending on whether a back control gate of n-type or p-type is used) and $\alpha$ represents a factor associated with the geometry of the transistor.

It will therefore be understood that the doping type of the back control gate associated with a transistor may or may not shift the nominal threshold voltage, but that by biasing the back control gate it is possible to adjust the threshold voltage. It is thus possible to benefit from an increase in the conduction current $I_{ON}$ in the on-state of the transistor (by reducing the threshold voltage) and from a reduction in the small leakage current $I_{OFF}$ in the off-state of the transistor (by increasing the threshold voltage). A contribution may also be made to the isolating function of an isolation region separating the adjacent patterns along a row by reducing the leakage current therein.

As presented in the thesis "Architectures innovantes de mémoire non-volative embarquée sur film mince de silicium (Innovative non-volatile memory architectures on thin silicon films)" defended by Germain Bossu in June 2009 at the Provence, Aix-Marseille University I, the factor $\alpha$ may in particular be approximated as $\alpha=3t_{ox1}/(t_{Si}+3t_{ox2})$, where $t_{ox1}$ denotes the thickness of the dielectric gate film separating the front control gate from the channel (typically 1-2 nm), $t_{ox2}$ denotes the thickness of the insulating film separating the back control gate from the channel (typically 5-20 nm for SeOI substrates) and $t_{Si}$, denotes the thickness of the thin semiconductor film.

Figure 2:
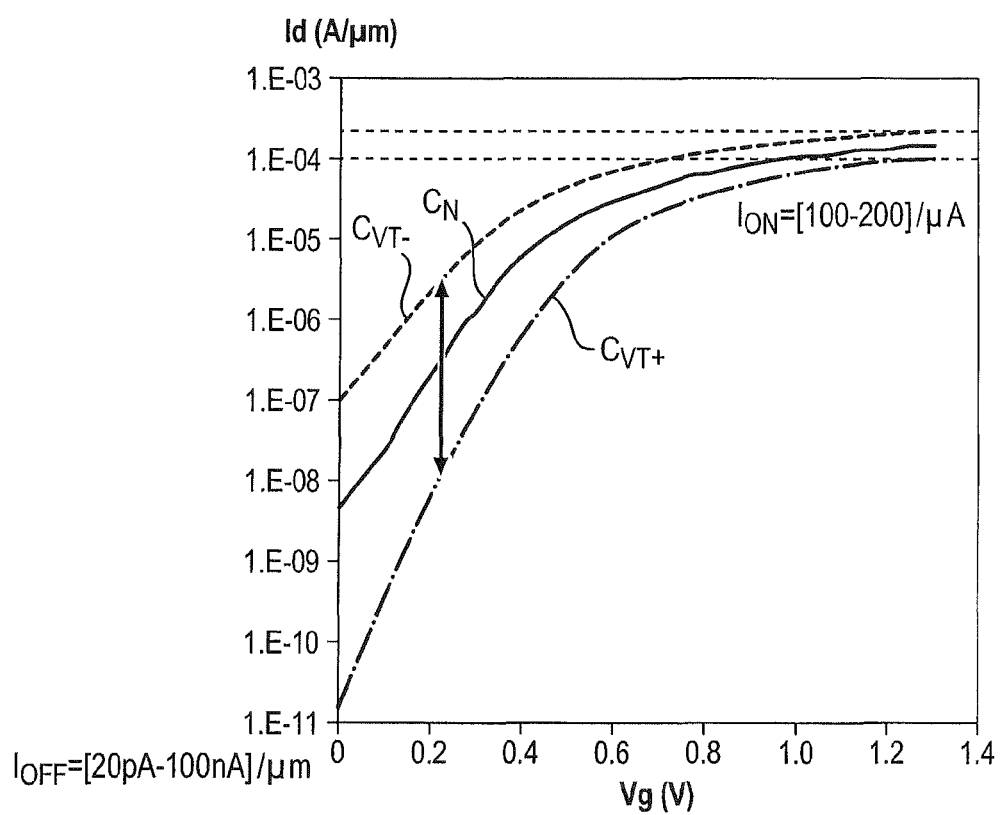
FIG. 2 illustrates control of the threshold voltage of a transistor by biasing a back control gate.

FIG. 2 illustrates the control of the threshold voltage of a transistor produced on a SeOI substrate by biasing a back control gate fabricated in the base substrate, beneath the insulating film and facing the channel of the transistor. In this figure, the central curve $C_N$ represents the nominal characteristic $\log(I_D(V_G))$ (for a transistor with no back control gate).

The upper curve $C_{VT-}$ (that is, C with subscript VT-) represents the characteristic $\log(I_D(V_G))$ under the effect of a back control gate driven with a voltage below the nominal supply voltage $V_{DD}$ of the circuit. This upper curve illustrates the increase in the threshold voltage and the reduction in the currents $I_{ON}$ and $I_{OFF}$. The lower curve $C_{VT+}$ (that is, C with subscript VT+) represents the characteristic $\log(I_D(V_G))$ under the effect of a back control gate driven with a nominal supply voltage $V_{DD}$. This lower curve illustrates the reduction in the threshold voltage and the increase in the currents $I_{ON}$ and $I_{OFF}$.

It will thus be understood that, by varying the back control gate bias, it is possible to cover the entire area between the lower curve $C_{VT-}$ and the upper curve $C_{VT+}$, thus modulating the threshold voltage of the transistor and its characteristic currents $I_{ON}$ and $I_{OFF}$.

The following equation links in particular the current $I_D$ in the channel to the channel width W and to the threshold voltage $V_{th}$:

$$I_D = \frac{\mu_n C_{ox} W}{2L}(V_{GS}-V_{th})^2(1+\lambda V_{DS}).$$

Consider a first example in which the gate and drain voltages are 0.9 V ($V_{GS}=V_{DS}=0.9$ V), with $\lambda=0.05$, and the threshold voltage is $V_{th}=0.3$ V. By modifying the threshold voltage of the transistor so that it takes a value between 0.05 V and 0.6 V, it is then possible to simulate a modification in the physical width of the channel (at fixed $I_D$). Theoretically, the effective width of the transistor channel can be modified between 0.25 and 2.01 times the physical width ($W_0$) of the channel.

Consider a second example with lower gate and drain voltages, namely 0.7 V, and further consider again modifying the threshold voltage of the transistor so that it takes a value between 0.05 V and 0.6 V. Then, the effective width of the channel can be theoretically modified between 0.06 and 2.64 times the physical width of the channel The invention thus allows a reduction/increase of the effective channel width. This control is particularly important when the supply voltages are low. In this regard, since the tendency in the technical field of the invention is for future generations of electronic components to use ever lower supply voltages, this invention can become, a priori, even more significant for such future generations.

FIGS. 3 to 7 illustrate the active zone beneath the insulating film of a circuit similar to that in FIG. 1 according to various embodiments and aspect of the invention.

Figure 3:
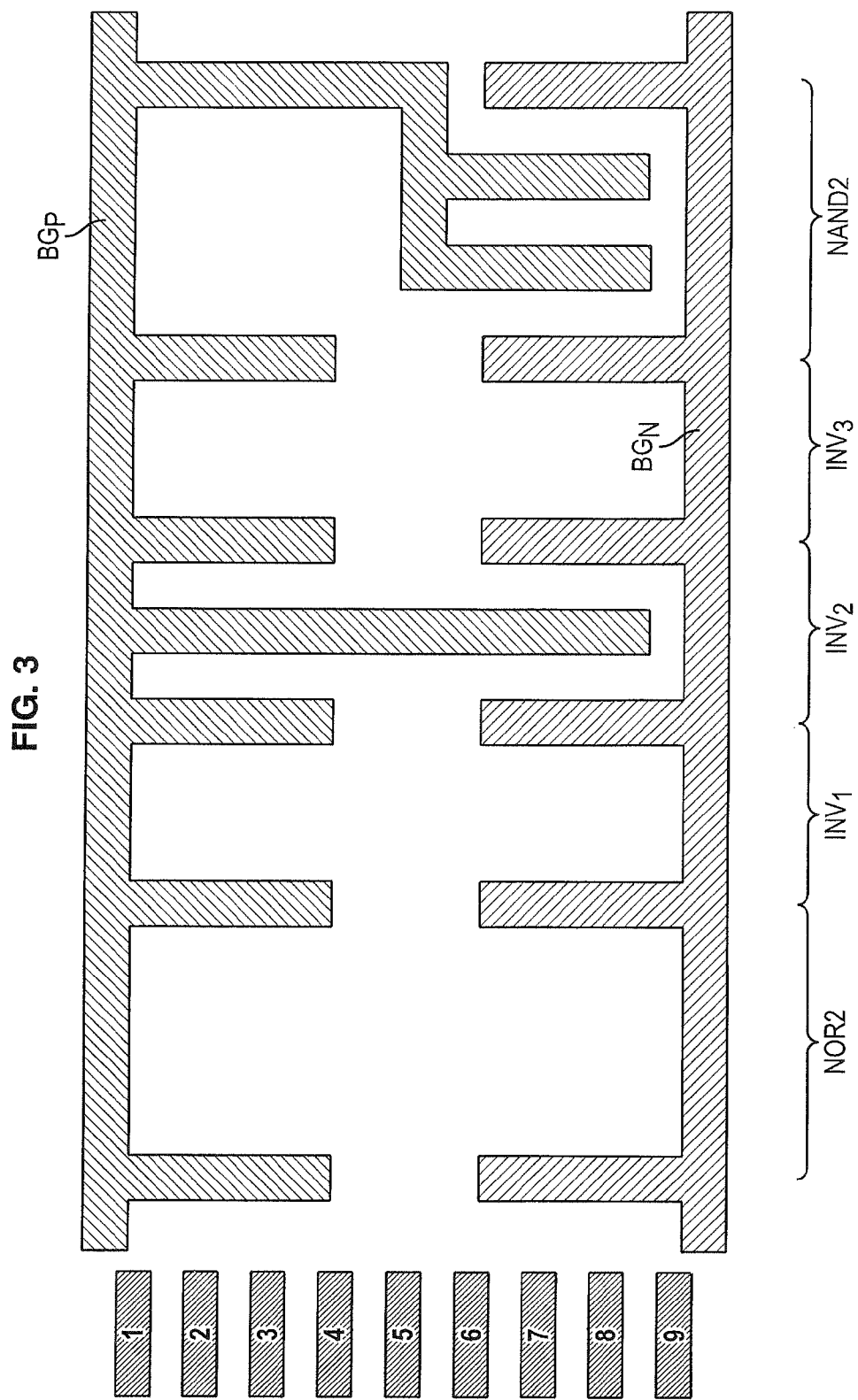
FIGS. 3 to 7 illustrate various embodiments of an active zone beneath the insulating film of a SeOI substrate.

In FIG. 3:
p-doped back control gate regions are associated with: the isolation regions $I_{P1}$-$I_{P6}$; the two p-FET and n-FET transistors of the inverter $INV_2$; and with the two n-FET transistors of the logic gate NAND2; and
n-doped back control gate regions are associated with the isolation regions $I_{N1}$-$I_{N6}$ and with f the two p-FET and n-FET transistors of the inverter $INV_3$.

A back gate line $BG_P$ and a back gate line $BG_N$ serve for collectively connecting the p-doped back gate regions and the n-doped back gate regions, respectively, to the same potential. The line $BG_P$ associated with the p-doped back gates may thus be in a high state (being typically connected to the potential $V_{DD}$), whereas the line $BG_N$ associated with the n-doped back gates may be in a low state (being typically connected to ground GND).

In such a manner, the isolation regions experience higher threshold voltages and consequently lower leakage currents $I_{OFF}$, thus helping to maintain better isolation between adjacent patterns along any one row.

As regards the inverter $INV_2$, the back control gate of the p-FET transistor and that of the n-FET transistor are in the high state $V_{DD}$. The conduction current $I_{ON}$ of the n-FET transistor is increased, while the conduction current of the p-FET transistor is reduced. This inverter thus has a low p-FET and a high n-FET. As regards the inverter $INV_3$, this inverter has a high p-FET and a low n-FET, because the back control gate of the p-FET transistor and that of the n-FET transistor are in the low state GND.

As regards the logic gate NAND2, the p-FET transistors do not have a back control gate and therefore operate in the nominal manner. The n-FET transistors do have back control gates in the high state, and therefore have a higher conduction current.

Figure 4:
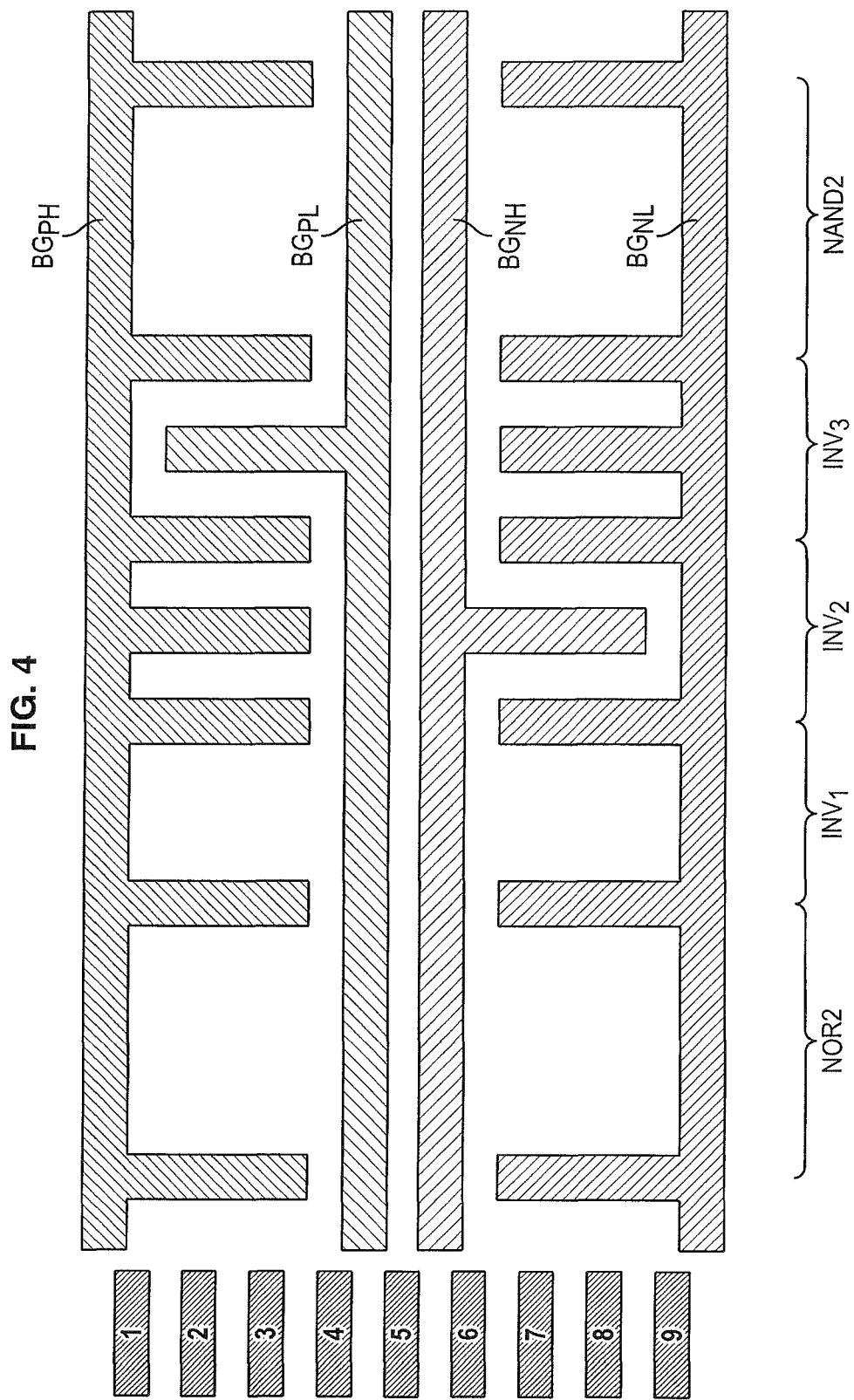

FIG. 4 shows another embodiment in which four different voltage levels are used to offer more flexibility. In FIG. 4:
- p-doped back control gate regions collectively connected to a back gate line $BG_{PH}$ in the high state are associated with the isolation regions $I_{P1}$-$I_{P6}$ and with the p-FET transistor of the inverter $INV_2$;
- a p-doped back control gate region connected to a back gate line $BG_{PL}$ in a low state is associated with the p-FET transistor of the inverter $INV_3$;
- n-doped back control gate regions collectively connected to a back gate line $BG_{NL}$ in a low state are associated with the isolation regions $I_{N1}$-$I_{N6}$ and with the n-FET transistor of the inverter $INV_3$; and
- an n-doped back control gate region connected to a back gate line $BG_{NH}$ in a high state is associated with the n-FET transistor of the inverter $INV_2$.

As in the example in FIG. 3, the leakage current of the isolation regions is thus reduced.

The inverter $INV_2$ has a low p-FET transistor (p-doped back control gate in a high state) and a high n-FET transistor (n-doped back control gate in a high state). In contrast, the inverter $INV_3$ has a high p-FET transistor (p-doped back control gate in a low state) and a low n-FET transistor (n-doped back control gate in a low state).

Figure 5:
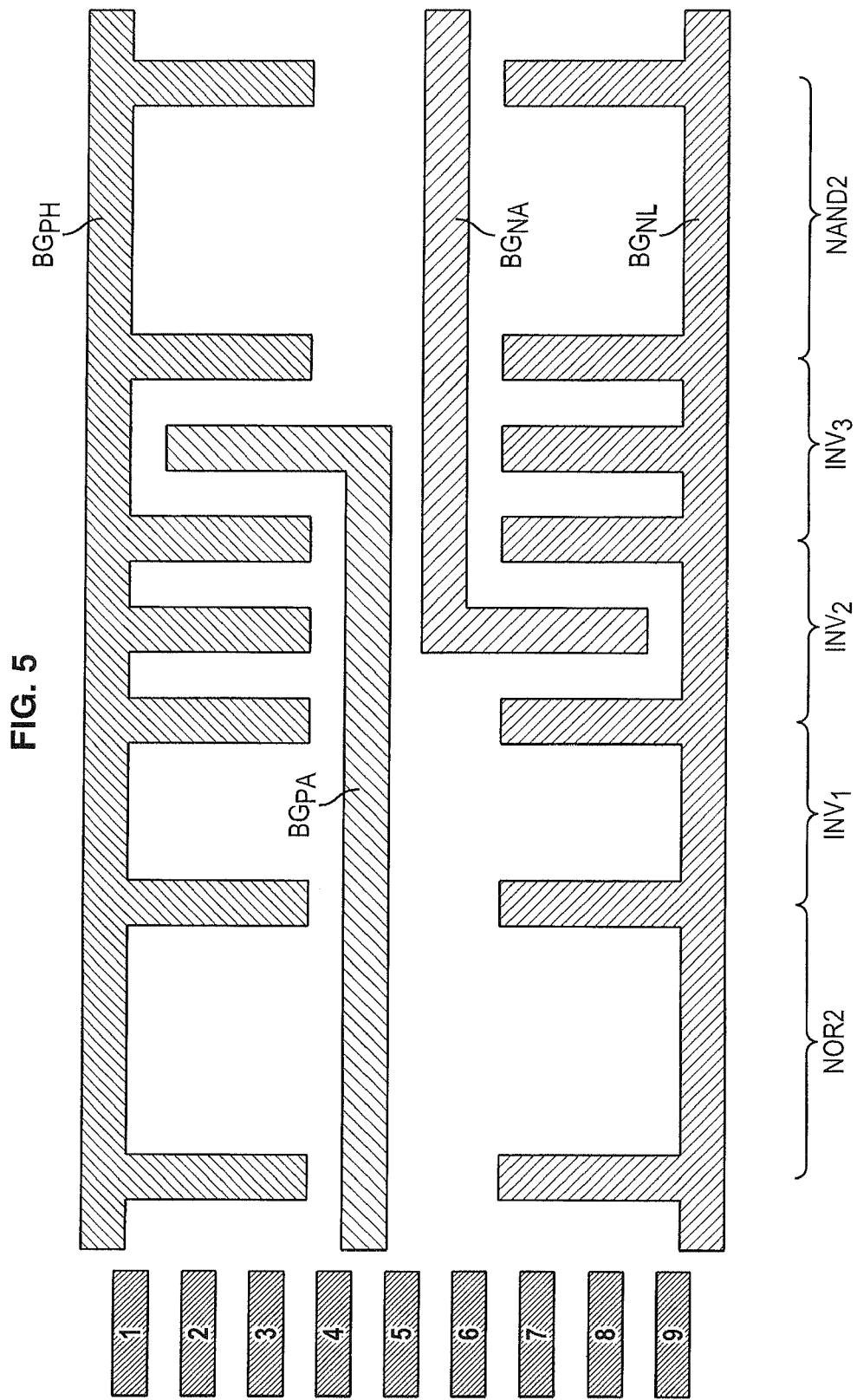

FIG. 5 shows another embodiment in which a back control gate associated with a transistor is connected to a back gate line which is associated only with that transistor. It will be understood that such an embodiment enables the potential applied to the back gate line dedicated to a single transistor to be modulated. In FIG. 5:
- p-doped back control gate regions are collectively connected to a back gate line $BG_{PH}$ in a high state, and are associated with the isolation regions $I_{P1}$-$I_{P6}$ and with the p-FET transistor of the inverter $INV_2$;
- a p-doped back control gate region connected to an individual back gate line $BG_{P4}$, the voltage of which can be adjusted, is associated with the p-FET transistor of the inverter $INV_3$;
- n-doped back control gate regions are collectively connected to a back gate line $BG_{NL}$ in a low state, and are associated with the isolation regions $I_{N1}$-$I_{N6}$ and with the n-FET transistor; and
- an n-doped back control gate region connected to an individual back gate line $BG_{N4}$, the voltage of which can be adjusted, is associated with the n-FET transistor of the inverter $INV_2$.

Thus, the inverter $INV_2$ has a low p-FET transistor (p-doped back control gate in a high state) and an adjustable n-FET transistor (an individual n-doped back control gate addressed via the line $BG_{N4}$, the potential of which can be adjusted). The inverter $INV_3$, this has a low n-FET transistor (n-doped back control gate in a low state) and an adjustable p-FET transistor (individual p-doped back control gate addressed via the line $BG_{P4}$, the potential of which can be adjusted).

Figure 6:
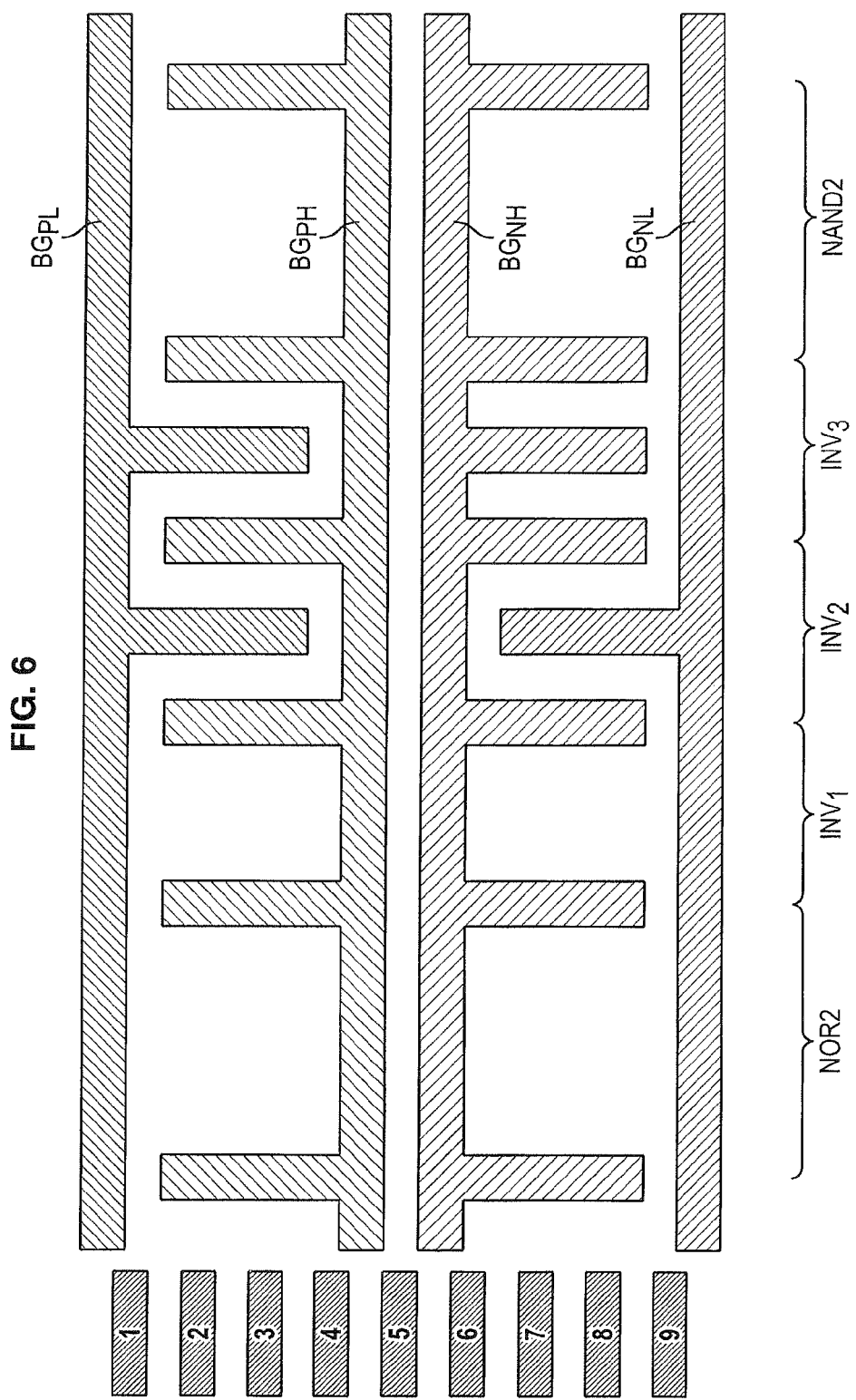

FIG. 6 shows an alternative embodiment of the example of FIG. 4. In FIG. 6:
- p-doped back control gate regions are collectively connected to a back gate line $BG_{PH}$ in a high state, and are associated with the isolation regions $I_{P1}$-$I_{P6}$;
- p-doped back control gate regions are collectively connected to a back gate line $BG_{PL}$ in a low state, and are associated with the p-FET transistor of the inverter $INV_2$ and with the p-FET transistor of the inverter $INV_3$;
- n-doped back control gate regions are collectively connected to a back gate line $BG_{NH}$ in a high state, and are associated with the isolation regions $I_{N1}$-$I_{N6}$ and with the n-FET transistor of the inverter $INV_3$; and
- an n-doped back control gate region is connected to a back gate line $BG_{NL}$ in a low state, and is associated with the n-FET transistor of the inverter $INV_2$.

Thus, the inverter $INV_2$ has a high p-FET transistor (p-doped back control gate in a low state) and a low n-FET transistor (n-doped back control gate in a low state). The inverter $INV_3$ has a high p-FET transistor (p-doped back control gate in a low state) and a high n-FET transistor (n-doped back control gate in a high state).

Figure 7:
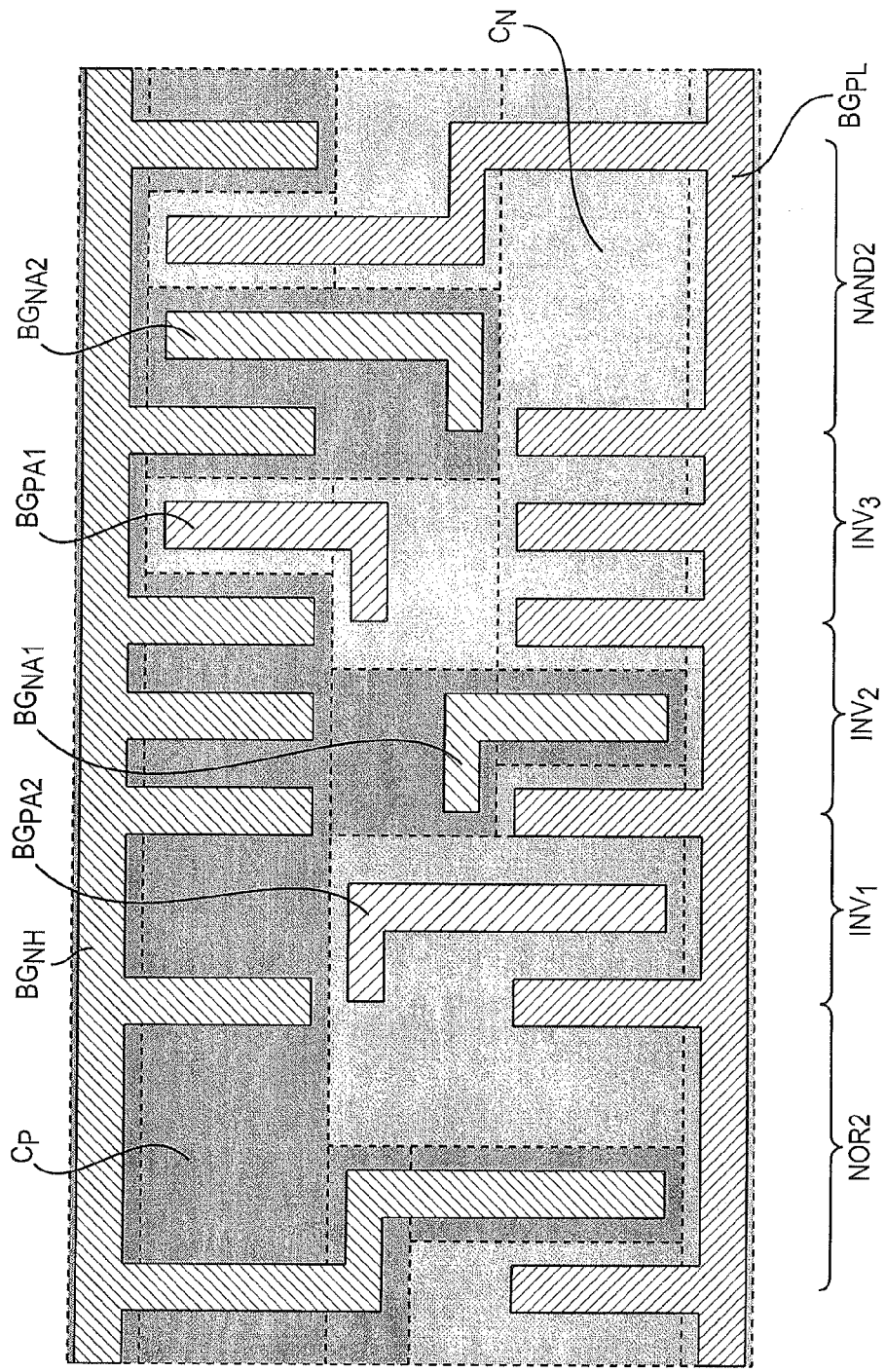

FIG. 7 shows a preferred embodiment in which the isolation regions are associated with back control gate regions having a conductivity of opposite type. The leakage currents in these isolation regions are thus further reduced.

More precisely, in FIG. 7:
- n-doped back control gate regions are collectively connected to a back gate line $BG_{NH}$ in a high state, and are associated with: the isolation regions $I_{P1}$-$I_{P6}$; one of the n-FET transistors of the logic gate $NOR_2$; and the p-FET transistor of the inverter $INV_2$;
- a p-doped back control gate region is connected to an individual back gate line $BG_{PA1}$, the voltage of which can be adjusted (to any intermediate value chosen by the skilled person), and is associated with the p-FET transistor of the inverter $INV_3$;
- p-doped back control gate regions collectively are connected to a back gate line $BG_{PL}$ in a low state, and are associated with the isolation regions $I_{N1}$-$I_{N6}$, with one of the p-FET transistors of the logic gate NAND2 and with the n-FET transistor of the inverter $INV_3$;
- a p-doped back control gate region is connected to an individual back gate line $BG_{PA2}$, the voltage of which can be adjusted (to any intermediate value chosen by the skilled person), and is associated with the n-FET transistor of the inverter $INV_1$;
- an n-doped back control gate region is connected to an individual back gate line $BG_{NA1}$, the voltage of which can be adjusted (to any intermediate value chosen by the skilled person), and is associated with the n-FET transistor of the inverter $INV_2$; and
- an n-doped back control gate region is connected to an individual back gate line $BG_{NA2}$, the voltage of which can be adjusted (to any intermediate value chosen by the skilled person), and is associated with the p-FET transistor of the logic gate NAND2 which is not connected to $BG_{PL}$.

Thus, the isolation regions $I_{P1}$-$I_{P6}$ have a p-channel with a p-type back control gate in the high state (typically at $V_{DD}$). These regions have a maximum threshold voltage and consequently a minimum leakage current. The isolation regions $I_{N1}$-$I_{N6}$ themselves have an n-channel with an n-type back control gate in the low state (typically at GND). These regions have a maximum threshold voltage and consequently a minimum leakage current.

One of the n-FET transistors of the logic gate $NOR_2$ also has an n-channel, but with an n-type back control gate in the high state. It thus has a minimum threshold voltage and consequently maximum performance characteristics (in terms of conduction current $I_{ON}$). The n-FET transistor of the inverter $INV_1$ has an n-channel with a p-type back control gate, the voltage of which can be adjusted. Thus, this transistor has performance characteristics lying between the minimum performance characteristics and the mean performance characteristics depending on the voltage applied to the individual line $BGP_{A2}$.

The p-FET transistor of the inverter $INV_1$ does not have a back control gate, and therefore it operates in a nominal manner.

The n-FET transistor of the inverter $INV_2$ has an n-channel with an n-type back control gate, the voltage of which can be adjusted. Thus, this transistor has performance characteristics lying between the mean performance characteristics and the maximum performance characteristics depending on the voltage applied to the individual line $BGP_{N41}$.

The p-FET transistor of the inverter $INV_3$ has a p-channel with a p-type back control gate, the voltage of which can be adjusted. Thus, this transistor has performance characteristics lying between the minimum performance characteristics and the mean performance characteristics depending on the voltage applied to the individual line $BGP_{P41}$.

The p-FET transistor of the logic gate NAND2, which does have an n-type back control gate, the voltage of which can be adjusted via the individual line $BG_{NA2}$, has performance characteristics lying between the mean performance characteristics and the maximum performance characteristics. The p-FET transistor of the logic gate NAND2, which has a p-type back control gate, the voltage of which is in the low state via the line $BG_{PL}$, has itself a minimum threshold voltage and maximum performance characteristics.

In FIG. 7, the references $C_P$ and $C_N$ represent the wells that isolate the n-type and p-type back control gates respectively. The wells $C_P$ are typically in the low state GND, whereas the wells $C_N$ are typically in the high state $V_{DD}$.

Figure 8:
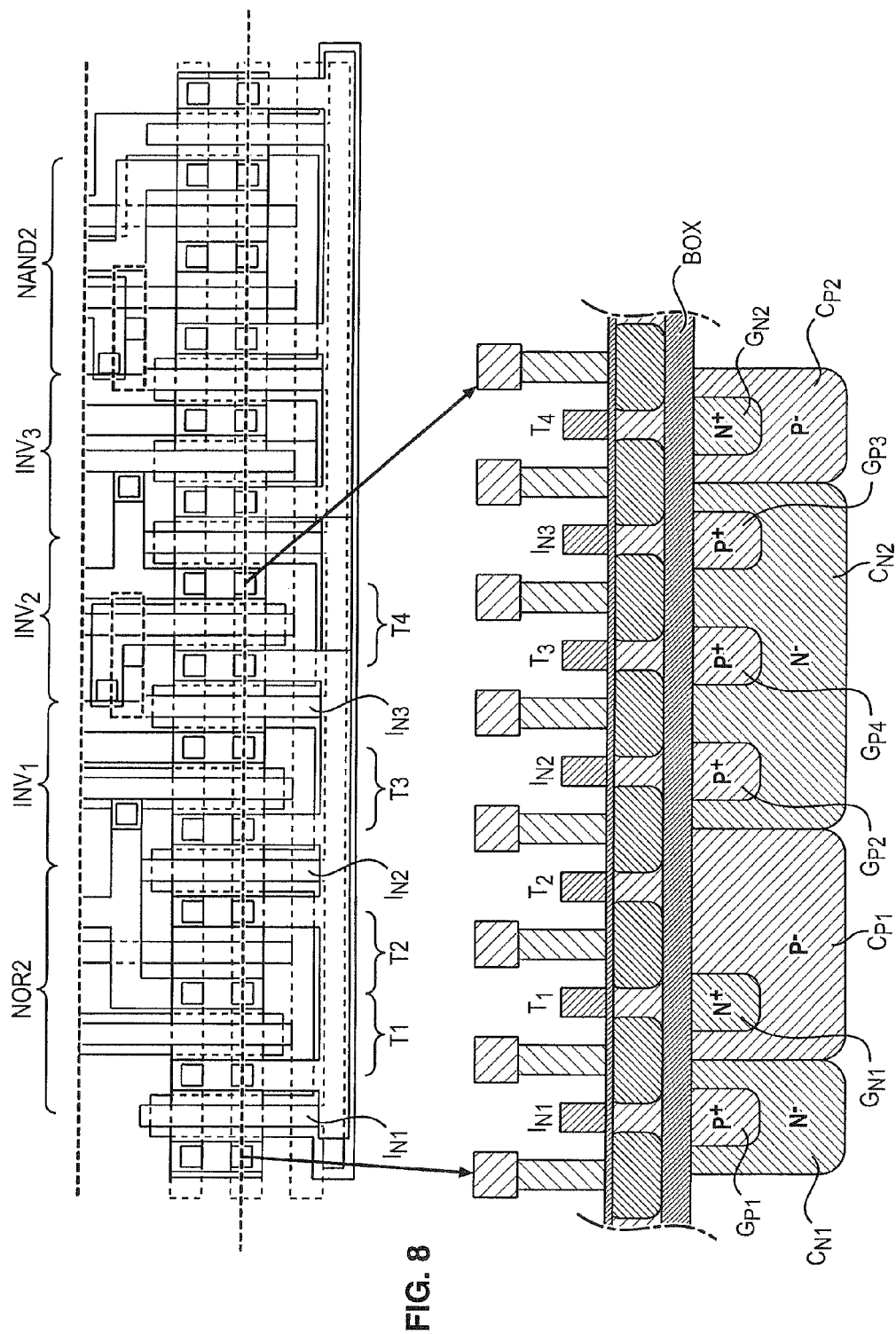
FIG. 8 illustrate a sectional view of a row of transistors of the circuit of FIG. 7.

The upper part of FIG. 8 shows two metal (preferably at level 2) lines, 7 and 8, along which the FET transistors of the circuit shown in FIG. 7 are placed. The lower part of FIG. 8 shows a sectional view of a portion of metal (preferably at level 2) line 8 comprising the isolation regions $I_{N1}$-$I_{N3}$ and the n-FET transistors $T_1$-$T_4$ of the NOR2 ($T_1$ and $T_2$), $INV_1$ ($T_3$) and $INV_2$ ($T_4$) patterns. In this sectional view, the insulating film bears the reference BOX.

In FIG. 8, the transistor channels are fully depleted, the source and drain regions being in contact with the insulating film. However, the invention also applies to the partially depleted technology in which the source and drain regions do not extend into the entire thin film. It should be noted in this case that the back control gate is overall less effective as it is further away from the channel region between the source and drain regions.

In FIG. 8, and as discussed above, the isolation regions $I_{N1}$-$I_{N3}$ have an n-channel and each region has a p$^+$-type back control gate $G_{P1}$-$G_{P3}$ (in the low state via the line $BG_{PL}$).

In FIG. 8, one of the nFET transistors, $T_1$, of the logic gate NOR2 has an n$^+$-type back control gate $G_{N1}$ (in the high state via the line $BG_{NH}$), whereas the other nFET transistor, $T_2$, of the logic gate NOR2 does not have a back control gate.

In FIG. 8, the nFET transistor $T_3$ of the inverter INV1 has a p$^+$-type back control gate $G_{P4}$ (which can be adjusted via the individual line $BG_{P42}$). The nFET transistor $T_4$ of the inverter $INV_2$ has an n$^+$-type back control gate $G_{N2}$ (which can be adjusted via the individual line $BG_{N41}$).

In FIG. 8, the associated back control gate is localized so as to extend only opposite the channel of the associated transistor. For example, the back control gate is formed by implanting dopants beneath the insulating film BOX. The back control gate is isolated from the base substrate by a well $C_{N1}$, $C_{P1}$, $C_{N2}$, $C_{P2}$ of opposite conductivity to that of the control gate (n$^-$-type well $C_{N1}$, $C_{N2}$ for a p$^+$-type back control gate $G_{P1}$, $G_{P2}$, $G_{P3}$, $G_{P4}$; p$^-$-type well $C_{P1}$, $C_{P2}$ for an n$^+$-type back control gate $G_{N1}$, $G_{N2}$).

The well voltage is chosen so that the diode created by the electrical node between the back control gate and the well is always reverse-biased, the diode isolating the back control gate from the well and from anything that it may contain (especially other back control gates). In fact, it is of course possible to provide a well common to several back control gates of the same type, as is the case for the well $C_{N2}$ which collectively isolates the back control gates $G_{P2}$, $G_{P3}$ and $G_{P4}$.

According to an alternative embodiment (not shown), a second insulating film, placed in the base substrate beneath the insulating film, BOX, may contribute, fully or partly, to isolating a back control gate from the base substrate.

A device according to the invention has the following advantages. A wide performance range may be obtained for the p-FET and n-FET transistors while using only a single physical channel width. Typically, three types of performance are the following:

regular performance, in the absence of a back control gate: with the transistor then being an ordinary SeOI transistor and it is unnecessary to modify the existing circuit designs;

boosted performance, with an "ON" back control gate, increasing the conduction of the transistor: with the transistor then operates as if it were wider than it actually is, or it has a smaller footprint per performance unit (speed, $I_{ON}$); and reduced performance, with an "OFF" back control gate, reducing the conduction of the transistor: with the transistor then operating as if it were narrower than it actually is. This may prove to be advantageous when performance ratios are desired (in the case of latches, for example, of the flip-flop type) since it is therefore unnecessary to widen another device. The leakage currents are also significantly reduced. This type of performance may thus be used in the off-states so that, in so far as no transistor switches (no ratio to be respected), the leakage current $I_{OFF}$ then being reduced.

However, the invention is in no way limited to these three types of performance. Indeed, the performance characteristics can be dynamically modulated by applying an analog and (preferably, continuously) adjustable bias to the back control gate of a transistor. Any kind of performance in between the above mentioned "reduced performance" and the "boosted performance" can therefore be achieved.

In a particular variant, the back control gate may be biased by any one of multiple predefined voltages. These multiple voltages are typically voltages that are available in the environment of the device, such as Vdd, various multiples or fractions of Vdd (such as Vdd*2, Vdd/4) and various combinations of available voltages (such as Vdd−Vtp, Vdd−Vtn, etc.). Thereby, the ratios between the pFET and nFET transistors may be adjusted without having to modify the channel width.

Thus, it will be understood that a device structure according to the invention obviates the needs encountered in the conventional designs for transistors having different dimensions. Effectively only a single physical width and simplified transistor models and parameters are used. It should be pointed out that the transistor models are actually complex equations with many secondary (parasitic) or tertiary edge effects. Most of these effects depend on the dimensions of the transistor and, for recent technologies, the environment (proximity stress). In this invention, a single topology can be used, and the models can then be greatly simplified (this results in more rapid availability, shorter development times, etc.).

Moreover, a device structure of this invention can have a very low variability because of the high level of regularity, and because only the polysilicon roughness remains, and because, when fully depleted structures are produced, fluctuation in the level of dopants disappears.

Moreover, a device structure of this invention can also be insensitive to edge rounding effects of patterns because all the channels have the same physical width. The active zone strip is effectively a long polygon, having no rounding near a polysilicon connection line. The 90° corner of such a line is also far from the active strip (both at the top and the bottom of the structure) and does not interact with the active strip.

Moreover, a device structure of this invention can be insensitive to cross-coupling effects. This is because, in conventional designs, it often happens that a polysilicon connection is adjacent to a drain of another logic gate. The two nodes are then capacitively coupled and mutually disturbed, generally resulting in communication delays. Since the status of the neighboring cells is unpredictable, this coupling cannot be taken into account in the model of each cell and is therefore discovered relatively late in the design of the application. In this invention, the interaction between active strip and polysilicon connection is the same whatever the status of the neighboring cells, thereby resolving this drawback encountered in conventional designs. In particular, the modelling of the coupling remains valid after circuit production.

Moreover, a device structure of this invention can have a reduced power consumption because of the association of back control gates with the isolation regions, which reduces leakage currents therein. There is the further possibility of dynamically acting on the back control gates associated with the transistors in their off-state, in order to further reduce the leakage currents.

To illustrate the effectiveness of the invention, it will be recalled that a standard CMOS cell library may comprise twelve inverters having different performance characteristics. The invention makes it possible, when applied in fully-depleted technology, to use only three inverters ($INV_1$, $INV_4$ and $INV_8$), because the effective channel width may be modulated between +/−50% of the physical width. In partially-depleted technology, only four inverters are necessary ($INV_1$, $INV_4$, $INV_6$ and $INV_9$), because the effective channel width may be modulated between +/−30% of the physical width. It follows that the standard cell library is considerably simplified—in fact it can be generally reduced by a factor of 2. Thus, although around a hundred design rules are used today, the invention makes it possible for only around fifty of to actually be used.

It should be noted in this regard that, in the past, the design rule manual contained approximately 100-200 rules. Since technologies are now generally below 100 nm, many physical effects are appearing that are resulting in new rules that prevent the simple and easy application of the initial set of 100-200 rules. At the 32 nm technology node, the design rule manual comprises about 800 to 1000 rules, in which most of the new rules are complex descriptions of difficult combinations of topologies. This entails a loss of efficiency in terms of footprint. In contrast, the efficiency of the invention remains generally constant across technology line sizes. Thus, if the invention and a conventional approach are generally equivalent in terms of footprint used at the 45 nm node, the invention will become increasingly more efficient at subsequent technology nodes.

Moreover, in so far as the set of design rules used in this invention can be a reduced subset of the usual set of rules, and because each of the rules used are applied in a single and unique context, it proves possible to design transistors below what the lithography might initially by presumed to permit. In particular, it is possible to optimize the width of contacts (for example by replacing two nominal square contacts by a single rectangular, and somewhat narrower, contact), and also to optimize the poly-contact distance.

Moreover, it should be noted that the back control gates have the advantage of being buried beneath the insulating film and consequently have no impact on the footprint. It should also be pointed out that the footprint may be reduced by about 10 to 15% since it is possible to generate strong conduction with the aid of cells "boosted" in accordance with the invention. Finally, it should be noted that the extreme regularity of (what is called) the "front-end" structure of the transistors is particularly suitable for the normal use of (what are called) "back-end" metallization for (what are called) "standard" cells (i.e. cells predesigned for general usage).

This is because standard cells are interconnected (routed) together via metallization levels that are alternately horizontal and vertical with a constant pitch. The reduction in number of design rules enormously facilitates the closing-off of the front-end and back-end constraints (the transistor repeat pitch and the routing pitch are made identical). The usage of standard cells then becomes easier since—by construction—the inputs/outputs are placed on the metal routing grid. In the conventional case, this is not always very easy and it is necessary in particular to take into account the possibility of reflecting the cells along the vertical and/or horizontal axes. However, keeping the inputs/outputs on the routing grid often means increasing the footprint of the standard cell. In the case of the invention, all these considerations are eliminated through the general simplification and pre-placement of the strips of transistors.

Moreover, the invention is not limited to providing the devices described, but rather the invention also provides methods of driving such devices in which the back control gate regions are biased positively or negatively in order to shift the threshold voltage of the transistors. Advantageously, a p-type back isolation gate can be connected to ground, and an n-type back isolation gate can be connected to a nominal supply voltage.

As mentioned above, the application of a back gate voltage on a FDSOI (fully-depleted SOI) transistor modifies the electrical characteristic of the device. Simply described, a higher voltage on the back gate reduces the threshold voltage of an N-channel device and vice-versa. The same applies on P channel devices.

It is possible to saturate this effect by applying very high voltages on the back gates. For instance a (very) high voltage applied on an N-channel transistor can reduce its threshold down to a negative value, making the transistor always ON, despite the voltage level applied on its front gate. On the contrary, a (very) high negative voltage on the back gate increases the threshold above the power supply, Vdd, at a level at which the transistor remains OFF for all operating voltages applied on its front gate (0–Vdd). By symmetry the same apply on the complementary P channel device.

Figures 9, 10:
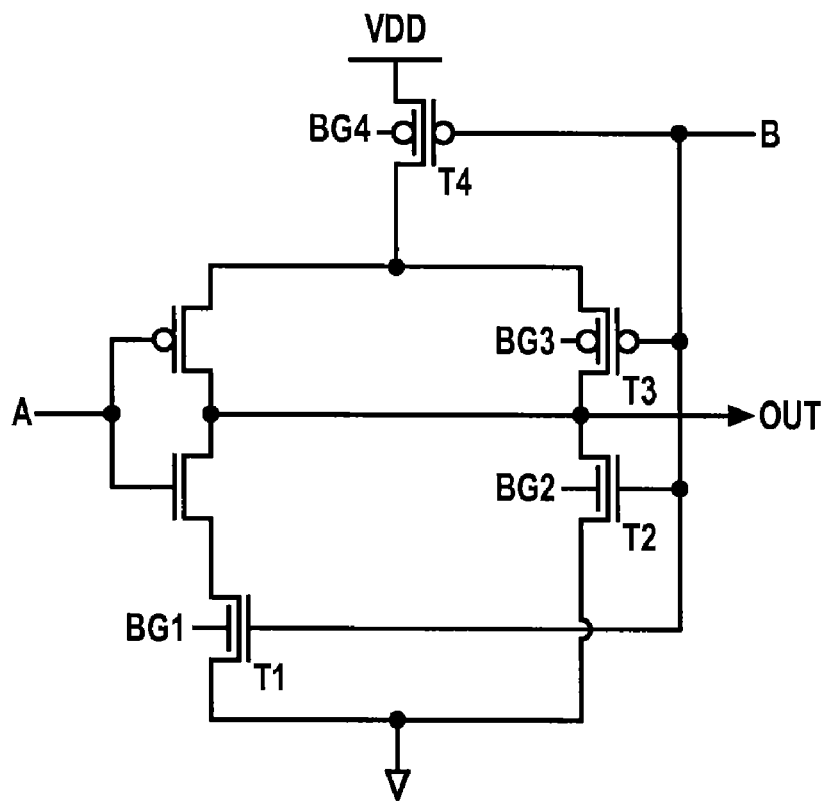
FIG. 9 illustrates an example of a logic circuit that is reconfigurable to cover all 2-input Boolean functions by means of appropriate voltages applied of the back gates of the various transistors.
FIG. 10 illustrates the truth table of the reconfigurable logic circuit of FIG. 9.

In other words, transistors can be transformed into "open" and "shorts" through an appropriate back gate control voltage. This feature proves to be particularly efficient for creating reconfigurable logic. FIG. 9 represents an example of a reconfigurable logic circuit that can be controlled to perform all 2-input Boolean functions, depending on the voltage applied on the back gate BG1-BG4 of the various transistors T1-T4, as indicated on the truth table of FIG. 10. In FIG. 9, A and B represent the two inputs of the reconfigurable logic circuit, while OUT represents the output of the reconfigurable logic circuit.

In FIG. 10, Vpp represents a voltage that is sufficiently high to force the threshold voltage either to a negative value (the transistor is always ON) or a value higher than the supply voltage Vdd (the transistor is always OFF) for a N-channel transistor, and respectively to a value either positive or greater than Vdd in absolute value for a P-channel transistor. It will be noted that this principle of reconfigurable logic can easily be extended to 3 or more inputs.

Transforming transistors into "opens" and "shorts" through an appropriate back gate control proves useful for re-programmable circuits, such as FPGAs for instance. In this case, the back gate is not used to modulate the strength of the transistor, but to establish or cut electrical links between a group of transistors. Of interest is that the layout of a re-programmable cell is unique for all functions.

The voltage applied to the different back gates advantageously comes from external, and if possible adjacent, circuits, such as SRAM cells or Flash cells. The programming voltages of the various functions that can be implemented by the re-programmable circuits of the invention can be stored in these circuits. As all Boolean functions can be programmed from this type of cell, then a unique and predefined back-end interconnection can be defined as well. As a result the pre-defined chip can be fully processed and then programmed by the end user.

Figure 11:
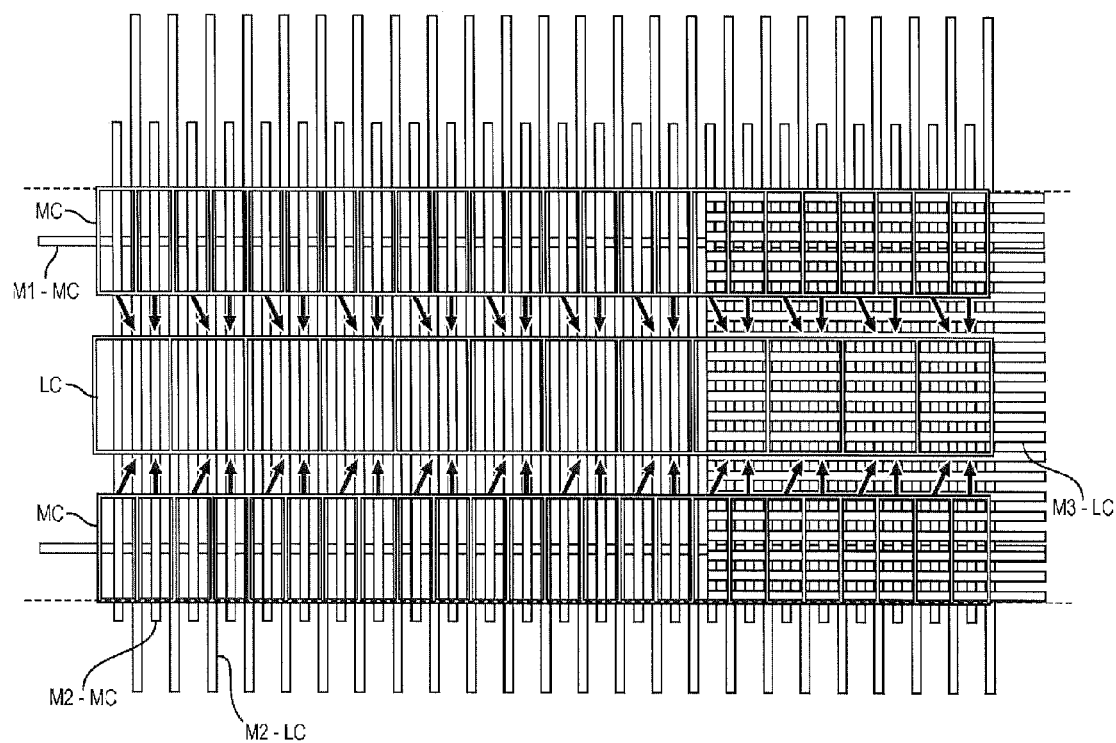
FIG. 11 illustrates an arrangement of logic cells and memory cells used to store the programming of the logic cells and to deliver the appropriate voltages to the back gates of the transistors of the logic cells.

FIG. 11 shows an example of a re-reprogrammable logic circuit according to the invention and indicates a possible arrangement of the logic cells, LC, (each logic cell corresponding for instance to the circuit of FIG. 9) and of the memory cells, MC, (SRAM or Flash) used to store the programming of the logic cells and to deliver the appropriate voltages to their back gates. In FIG. 11, strips of logical cells LC are interleaved with rows of memory cells MC. For clarity, the logic cells LC have been schematically represented by a box on FIG. 11, while the arrows originating from the memory cells MC represent the control of the back gate voltages of the logic cells LC by the memory cells MC.

In FIG. 11, the memory cells MC use only the metal layers (preferably at levels 1 or 2) at relatively relaxed pitches as the dimensions are induced by the transistor pitches in the logic area LC. M1-MC represents the metal (preferably at level 1, or "metal1") layer used for selecting rows of the memory cells MC, while M2-MC represents the metal (preferably at level 2) layer used for selecting columns of the memory cells. In particular there is still enough resources at the metal (preferably at level 2) level to connect different inputs and outputs of the logic cells LC to a predefined network composed by the upper metal layers.

In FIG. 11, M2-LC represents the metal (preferably at level 2) layer used for interconnecting tracks of logic cells LC, while M3-LC represents the metal (preferably at interconnect level 3, or "metal3") layer used for interconnecting tracks of logic cells LC.

The articles "a" or "an" are used herein in manners that are not limited to "only one," but can mean "one or more" as appropriate in the context. The words "significant" and "likely" (and similar words of degree) are used here to mean within acceptable and expected limits, usually commercially-acceptable limits. It should be understood that this invention is not limited to commercial uses; intended uses include research uses, special purpose uses, and so forth.

The preferred embodiments of the invention described above do not limit the scope of the invention, since these embodiments are illustrations of several preferred aspects of the invention. Equivalent embodiments are intended to be within the scope of this invention, and indeed, various modifications of the invention in addition to those shown and described herein, such as alternate useful combinations of the elements described, will become apparent to those skilled in the art from the subsequent description. Such modifications are also intended to fall within the scope of the appended claims.

What is claimed is:

1. A semiconductor device structure formed on a semiconductor-on-insulator substrate (SeOI), with the semiconductor-on-insulator substrate comprising a thin film of semiconductor material separated from a base substrate by an insulating film, and the device structure comprising:
   an array of patterns, with each pattern formed by at least one field-effect transistor with each such field-effect transistor having, within the thin semiconductor film of the SeOI substrate, a source region, a drain region, a channel region which is delimited by the source and drain regions, and a front control gate formed above the channel region;
   wherein the patterns of the array are arranged in rows, with the source and drain regions of any one row having the same dimensions and being spaced apart by front control gates of a fixed dimension, and
   wherein at least one such field-effect transistor of at least one pattern includes a back control gate formed within the base substrate of the SeOI substrate beneath the channel region, with the back control gate being biased in order to shift the threshold voltage of the transistor to simulate a modification in the channel width of the transistor.

2. The device structure of claim 1, wherein the back control gate is biased in order to force the transistor to remain off or on whatever the voltage applied on its front control gate.

3. The device structure of claim 1, wherein a plurality of the patterns in at least one row are formed on a single active zone of the thin semiconductor film of the semiconductor substrate, and wherein an isolation region delimits the adjacent patterns, the isolation region comprising a front isolation gate formed above the active zone and a back isolation gate formed in the base substrate beneath the active zone.

4. The device structure of claim 3, wherein a back isolation line formed within the base substrate of the SeOI substrate connects the back isolation gates of each of the isolation regions of at least one row.

5. The device structure of claim 4, wherein the back isolation line connects the back isolation gates of each of the isolation regions of a plurality of rows.

6. The device structure of claim 3, wherein the back isolation gate has a conductivity of opposite type to that of the active zone.

7. The device structure of claim 1, wherein a back gate line formed within the base substrate of the SeOI substrate connects the back control gates of one or more transistors.

8. The device structure of claim 7, wherein a back gate line connects the back control gates to ground or to a nominal supply voltage.

9. The device structure of claim 7, wherein a back gate line connects the back control gates to an analog and adjustable potential.

10. The device structure of claim 1, wherein the back control gate Previously Presented of at least one transistor is isolated from the base substrate by a well of opposite conductivity.

11. The device structure of claim 1, wherein the back control gate of at least one transistor has a conductivity of the same type as that of the channel of that transistor.

12. The device structure of claim 1, wherein the back control gate of at least one transistor has a conductivity of opposite type to that of the channel of that transistor.

13. A method of operating a device structure according to claim 1, which comprises biasing positively or negatively at least one back control gate in order to shift the threshold voltage of associated field-effect transistor.

14. The method of claim 13, wherein the back control gate is biased by an analog and adjustable potential.

15. The method of claim 13, wherein the shift of the threshold voltage is sufficient to cause the associated transistor to remain off or on whatever the voltage applied to its front control gate.

16. The method of claim 13, wherein the shift of the threshold voltage is programmed by memory cells that store and deliver predetermined voltages to the at least one back control gate.

17. A re-programmable circuit comprising a device structure according to claim 1, wherein two or more adjacent rows of the pattern are interleaved with at least one further row of memory cells, and wherein the memory cells store and deliver predetermined voltages to the back control gates of one or both of the adjacent rows of the pattern.

18. The circuit of claim 1, wherein in the device structure further comprises a back gate line within the base substrate of the SeOI substrate that connects the back control gates of the transistors.

* * * * *